United States Patent
Cosgrove et al.

(10) Patent No.: US 6,512,447 B1
(45) Date of Patent: Jan. 28, 2003

(54) BUSSING HIGH FREQUENCY CROSSPOINT SWITCHES

(75) Inventors: Kevin E. Cosgrove, Portland, OR (US); Robert A. Castlebary, Nevada City, CA (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 09/464,790

(22) Filed: Dec. 17, 1999

(51) Int. Cl.7 .............................................. G05B 23/02
(52) U.S. Cl. ................. 340/2.28; 825/2.29; 825/825.02
(58) Field of Search ............................ 340/2.28, 2.29, 340/825.02; 326/112, 115, 55, 59; 327/408, 427, 437; 709/200, 202, 205

(56) References Cited

U.S. PATENT DOCUMENTS

| | | | |
|---|---|---|---|
| 4,707,672 A | * 11/1987 | Duret et al. ..................... 33/4 |
| 4,849,751 A | * 7/1989 | Barber et al. ........... 340/825.02 |
| 5,331,206 A | 7/1994 | Liron .......................... 327/108 |
| 5,634,004 A | * 5/1997 | Gopinath et al. ........... 710/317 |
| 5,870,028 A | 2/1999 | Liron ......................... 340/2.29 |
| 5,925,097 A | * 7/1999 | Gopinath et al. ........... 709/200 |
| 5,945,847 A | * 8/1999 | Ransijn ...................... 326/115 |
| 6,040,732 A | * 3/2000 | Brokaw ....................... 327/408 |

* cited by examiner

Primary Examiner—Van Trieu
(74) Attorney, Agent, or Firm—Francis I. Gray

(57) ABSTRACT

Bussing high frequency crosspoint switches is achieved by extending an output transmission line bus through an integrated circuit (IC) upon which the crosspoint switch is laid. The internal portion of the output transmission line bus is coupled to an output pad on the IC via a bond wire. This eliminates stubs from the output of the IC to the output transmission line as well as compensating for parasitic capacitance associated with the output pad.

12 Claims, 3 Drawing Sheets

BUSSING HIGH FREQUENCY CROSSPOINT SWITCHES

BACKGROUND OF THE INVENTION

The present invention relates to the switching of high frequency signals, and more particularly to bussing high frequency crosspoint switches to increase the number of inputs that may be switched to any one output while reducing parasitic reactances that load an output bus.

Outputs of crosspoint switch integrated circuits (ICs) are usually connected together, or bussed, to increase the number of inputs that may be switched to any one output bus, as shown in U.S. Pat. Nos. 5,331,206 and 5,870,028. Of the crosspoint IC outputs bussed together on a given bus, at most the output from one IC is activated at any given time, with those outputs which share the same bus on all other ICs being deactivated. This works fine at low data rates. As the data rate increases, parasitic reactances in the crosspoint switch and on the circuit board or hybrid load the output bus and cause data pulse degradation.

Several methods have been tried to reduce this data pulse degradation problem, such as lowering the impedance of the transmission line to reduce the degradation. The degradation is reduced, but power dissipation is increased with this method. Other methods involve "buffering" of the parasitic reactances with resistors. Again the degradation is reduced and power dissipation suffers. Also buffering with resistors reduces the output amplitude and may shift the output direct current (DC) voltage.

IC input and/or output parasitic reactances may be used to advantage. By adding a second IC pad, a second bond wire with mutual inductance with the first bond wire may be used to decrease the effective IC capacitance. One skilled in the art may optimize this configuration to improve either bandwidth, group delay or port reflections as required by the application. When used on individual inputs or outputs, this circuit is commonly called a "T-coil." This circuit technique may be extended to interconnect multiple crosspoint switch ICs. The drawback of this technique is that it requires twice as many IC pads for each input and output. This substantially raises the area sensitive cost of the IC, especially on ICs where the die area is "pad limited", i.e., the lower bound for area depends primarily on the number of pads.

At the highest data rates, above 1 Gbit/s to HDTV or SONET OC-48 data rates, the bus looks like a transmission line and connections to the ICs look like transmission line stubs. These stubs cause reflections and decrease the bandwidth of the transmission lines. Reflections and decreased bandwidth increase jitter, which in some cases makes data recovery impossible.

What is desired is a technique for bussing high frequency crosspoint switches that decreases parasitic reactances without increasing area cost on ICs.

BRIEF SUMMARY OF THE INVENTION

Accordingly the present invention provides a technique for bussing high frequency crosspoint switches by having two output ports for each crosspoint IC coupled to an exterior portion of an output transmission line bus. The output transmission line bus runs from outside the IC, extending into the IC package close to the edge of the die. A bond wire connects the internal portion of the output transmission line bus to an output pad on the IC die which has a parasitic capacitance. This eliminates stub terminations on the output transmission line bus while compensating for the parasitic capacitance.

The objects, advantages and other novel features of the present invention are apparent from the following detailed discussion when read in conjunction with the appended claims and attached drawing.

DETAILED DESCRIPTION OF THE INVENTION

Figure 1:
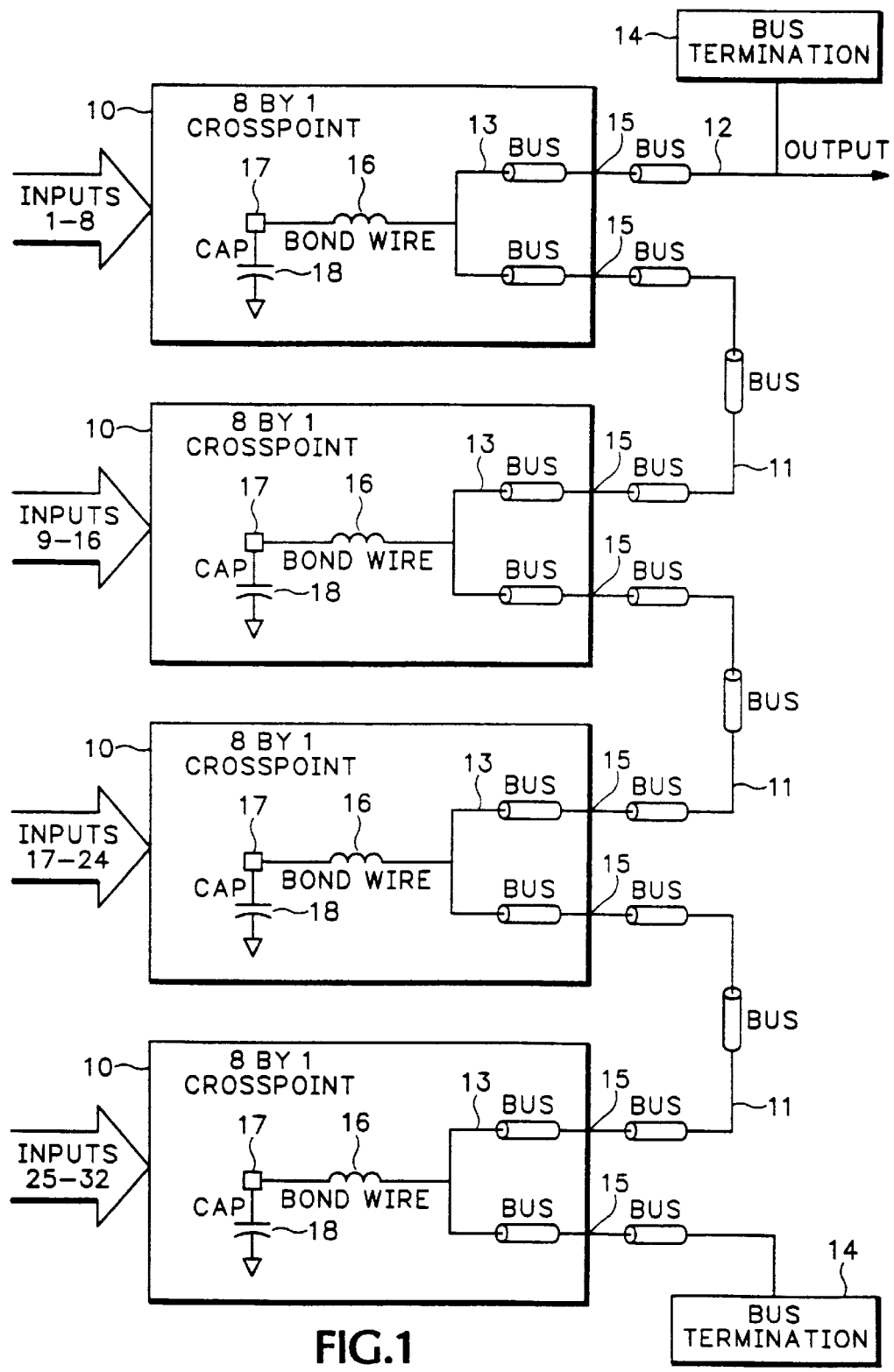
FIG. 1 is a partial schematic view for bussing high frequency crosspoint switches according to the present invention.

Referring now to the FIG. 1 a plurality of crosspoint switches 10 are shown, each having for illustrative purposes eight inputs. An output bus 12 having appropriate terminations 14 is coupled to each of the switches 10. Each of the switches has a pair of outputs 15 at the edge of the IC package upon which the switch 10 is contained. The output bus 12 is segmented so that a portion 11 of the bus is external to the switches 10 and a portion 13 extends internal to the switches. Thus the output bus 12 is coupled to the two output ports on each crosspoint IC. The output bus 12 runs from outside the IC package and extends into the IC package close to the edge of the die. A bond wire 16 couples the output bus 12 to a pad 17 on the IC die, which also has a parasitic capacitance 18. By having the output bus extend into the IC package, transmission line stubs are eliminated, reducing reflections and any decrease in bandwidth. This configuration results in a useful data rate from 1 Gbit/s to above 4.2 Gbit/s while avoiding an increase in die area and the associated area cost increase as only a single pad is used. The length of the bond wire 16 and a tapering of the internal transmission line 13 may be used to optimize performance at a desired high frequency by creating a temporal inductance to compensate for the parasitic capacitance 18.

Figure 2:
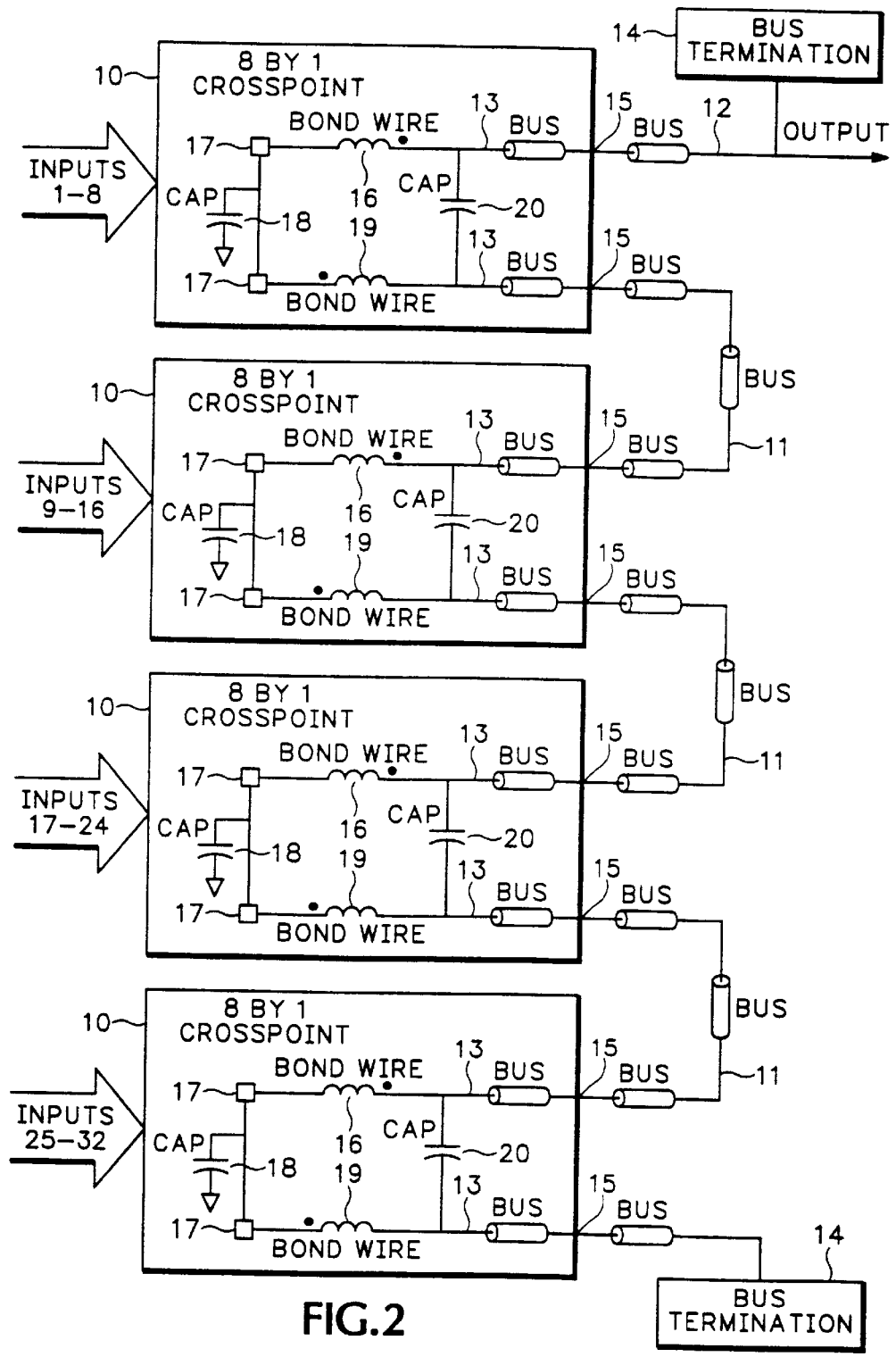
FIG. 2 is a partial schematic view for bussing high frequency crosspoint switches extended to even higher frequencies at increased area cost according to the present invention.

At even higher data rates it is possible to tune the transmission line impedances local to the lumped parasitic elements, as shown in FIG. 2, in order to reduce signal reflections and extend useful bandwidth even higher. This configuration adds to the area cost since a second pad 17 is used to provide a "T-Coil" configuration where the internal transmission lines 13 are coupled to respective pads via bond wires 16, 19 and a tuning capacitance 20 is added across the internal transmission line between the ends of the bond wires. The length of the bond wires and the tuning capacitance are adjusted for the desired low insertion loss or low reflection.

Although single ended circuits are shown in the FIGS. 1 and 2, this technique is effective when done differentially or single ended. With high density packages available, the ability to apply the "output bus through pin" concept to crosspoint ICs is practical. This concept may be applied equally to both the inputs and outputs of crosspoint ICs, as shown in FIG. 3 for one of the inputs of the crosspoint ICs.

Figure 3:
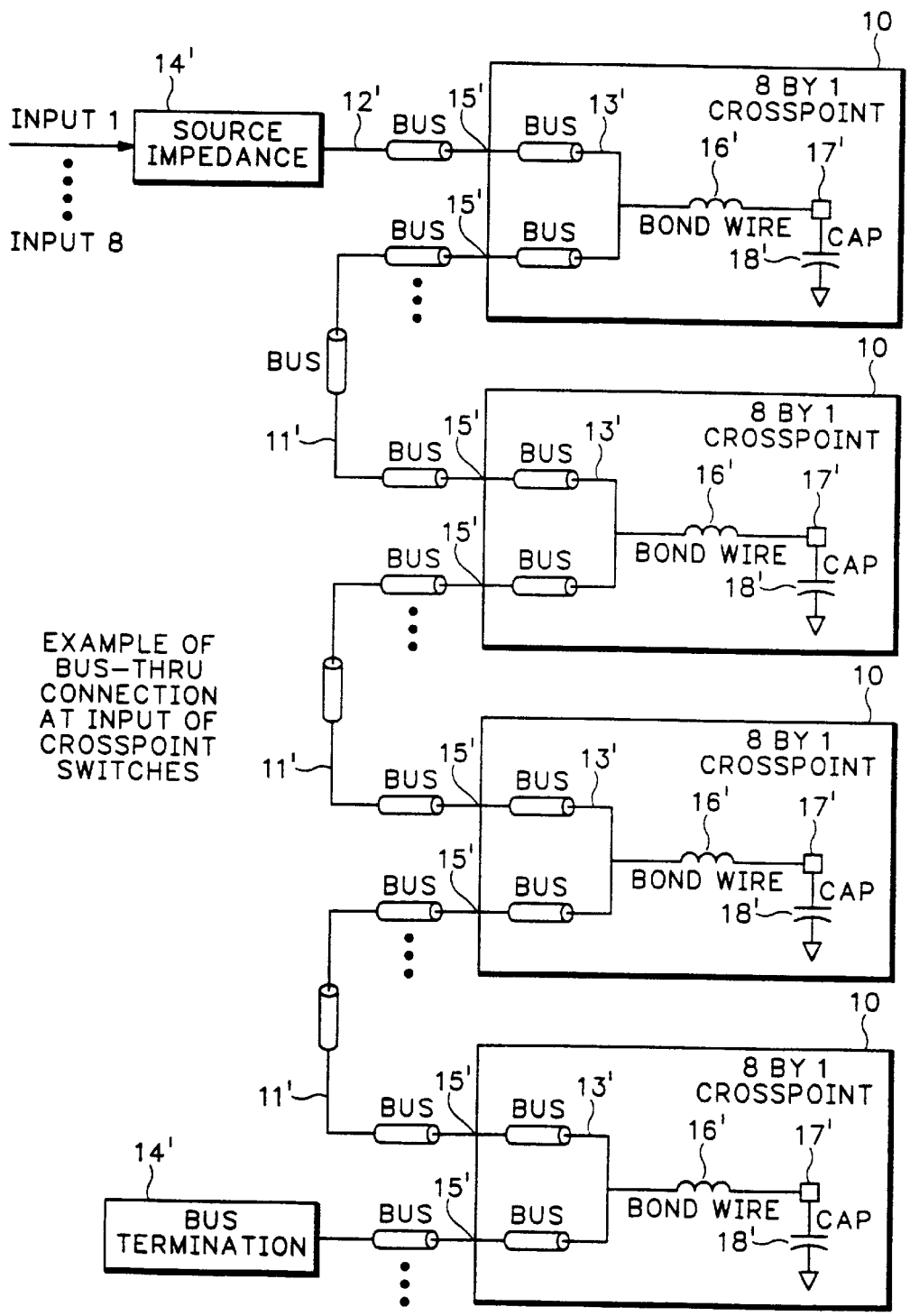
FIG. 3 is another partial schematic view for bussing high frequency crosspoint switches according to the present invention.

In FIG. 3 Input 1 is applied to an input bus 12' that has external (11') and internal (13') segments and appropriate source and bus terminations 14'. The input bus 12' is coupled to the crosspoint switch 10 at respective input ports 15' at the edge of the IC package with the internal segments 13' coupled between the respective input ports. A bond wire 16' couples the internal segment 13' to an input pad 17' on the IC die, which also has a parasitic capacitance 18'. This configuration eliminates input transmission line stubs, allowing useful data rates above 1 Gbit/s while avoiding an increase in die area and the associated area cost as only a single pad is used. As in the output transmission line configuration, the length of the bond wire 16' and a tapering of the internal segment 13' may be used to optimize performance at a desired high frequency by creating a temporal inductance to compensate for the parasitic capacitance 18'.

Thus the present invention provides for bussing high frequency crosspoint switches by extending an output transmission line bus into the IC die on which the switch is laid so the IC has two output transmission line ports, coupling the internal portion of the output transmission line bus to a pad with a bond wire. A T-Coil configuration may be used to extend the frequency range of the crosspoint switches at the cost of added area for a second pad.

What is claimed is:

1. A crosspoint switch of the type having a plurality of inputs selectable to provide a single output on an output transmission line bus comprising:

a first output pad;

a pair of output ports;

an internal transmission line bus coupled between the output ports; and a first bond wire coupled between the output pad and the internal transmission line bus;

whereby when the crosspoint switch is coupled to a matching segmented output transmission line bus, the internal transmission line bus and the matching segmented output transmission line bus form the output transmission line bus.

2. The crosspoint switch as recited in claim 1 further comprising:

a second output pad electrically coupled to the first output pad;

a second bond wire coupled between the second output pad and a second segment of the internal transmission line bus, the internal transmission line bus being split into two segments with a first segment being coupled by the first bond wire to the first output pad; and a tuning capacitance coupled between the ends of the two segments of the internal transmission line bus.

3. The crosspoint switch as recited in claim 2 where the internal transmission line bus is tapered to create a temporal inductance to compensate for parasitic capacitance associated with the first and second output pads.

4. The crosspoint switch as recited in claim 1 where the internal transmission line bus is tapered to create a temporal inductance to compensate for parasitic capacitance associated with the first output pad.

5. A crosspoint switch of the type having a plurality of inputs selectable to provide a single output on an output transmission line bus comprising for at least one input:

a first input pad;

a pair of input ports;

an input internal transmission line bus coupled between the input ports; and a first bond wire coupled between the input pad and the input internal transmission line bus;

whereby when the crosspoint switch is coupled to a matching segmented input transmission line bus, the input internal transmission line bus and the matching segmented internal transmission line bus form an input transmission line bus.

6. The crosspoint switch as recited in claim 5 further comprising:

a second input pad electrically coupled to the first input pad;

a second bond wire coupled between the second input pad and a second segment of the input internal transmission line bus, the input internal transmission line bus being split into two segments with a first segment being coupled by the first bond wire to the first input pad; and a tuning capacitance coupled between the ends of the two segments of the input internal transmission line bus.

7. The crosspoint switch as recited in claim 6 wherein the input internal transmission line bus is tapered to create a temporal inductance to compensate for parasitic capacitance associated with the first and second input pads.

8. The crosspoint switch as recited in claim 5 wherein the input internal transmission line bus is tapered to create a temporal inductance to compensate for parasitic capacitance associated with the first input pad.

9. The crosspoint switch as recited in claim 5 further comprising:

a first output pad;

a pair of output ports;

an output internal transmission line bus coupled between the output ports; and a first bond wire coupled between the output pad and the output internal transmission line bus;

whereby when the crosspoint switch is coupled to a matching segmented output transmission line bus, the output internal transmission line bus and the matching segmented output transmission line bus form the output transmission line bus.

10. The crosspoint switch as recited in claim 9 further comprising:

a second output pad electrically coupled to the first output pad;

a second bond wire coupled between the second output pad and a second segment of the output internal transmission line bus, the output internal transmission line bus being split into two segments with a first segment being coupled by the first bond wire to the first output pad; and a tuning capacitance coupled between the ends of the two segments of the output internal transmission line bus.

11. The crosspoint switch as recited in claim 10 where the output internal transmission line bus is tapered to create a temporal inductance to compensate for parasitic capacitance associated with the first and second output pads.

12. The crosspoint switch as recited in claim 9 where the output internal transmission line bus is tapered to create a temporal inductance to compensate for parasitic capacitance associated with the first output pad.

* * * * *